(12) United States Patent
Shieh et al.

(10) Patent No.: US 7,977,151 B2
(45) Date of Patent: Jul. 12, 2011

(54) DOUBLE SELF-ALIGNED METAL OXIDE TFT

(75) Inventors: Chan-Long Shieh, Paradise Valley, AZ (US); Gang Yu, Santa Barbara, CA (US)

(73) Assignee: Cbrite Inc., Goleta, CA (US)

( * ) Notice: Subject to any disclaimer, the term of this patent is extended or adjusted under 35 U.S.C. 154(b) by 260 days.

(21) Appl. No.: 12/427,200

(22) Filed: Apr. 21, 2009

(65) Prior Publication Data

US 2010/0267197 A1    Oct. 21, 2010

(51) Int. Cl.
*H01L 21/00*    (2006.01)
(52) U.S. Cl. ............... 438/104; 438/160; 257/E21.414
(58) Field of Classification Search .................. 438/159, 438/160

See application file for complete search history.

(56) References Cited

U.S. PATENT DOCUMENTS

| 5,721,164 A * | 2/1998 | Wu ............................. 438/159 |
| 6,380,009 B1 * | 4/2002 | Battersby ..................... 438/161 |
| 6,913,944 B2 * | 7/2005 | Hirai .............................. 438/99 |

* cited by examiner

*Primary Examiner* — Chandra Chaudhari
(74) *Attorney, Agent, or Firm* — Parsons & Goltry; Robert A. Parsons; Michael W. Goltry

(57) ABSTRACT

A method of fabricating metal oxide TFTs on transparent substrates includes the steps of positioning an opaque gate metal area on the front surface of the substrate, depositing transparent gate dielectric and transparent metal oxide semiconductor layers overlying the gate metal and a surrounding area, depositing transparent passivation material on the semiconductor material, depositing photoresist on the passivation material, exposing and developing the photoresist to remove exposed portions, etching the passivation material to leave a passivation area defining a channel area, depositing transparent conductive material over the passivation area, depositing photoresist over the conductive material, exposing and developing the photoresist to remove unexposed portions, and etching the conductive material to leave source and drain areas on opposed sides of the channel area.

23 Claims, 2 Drawing Sheets

DOUBLE SELF-ALIGNED METAL OXIDE TFT

FIELD OF THE INVENTION

This invention generally relates to a double self-alignment fabrication of metal oxide TFTs to remove critical alignment tools.

BACKGROUND OF THE INVENTION

Metal oxide thin film transistors (MOTFT) are gaining interest as high performance TFT backplanes for large area applications such as active matrix organic light emitting diodes (AMOLED). See for example the copending U.S. patent application entitled "Active Matrix Light Emitting Display" bearing Ser. No. 12/178,209, filed on 23 Jul. 2008, and incorporated herein by reference. Many of these large area applications use either glass or plastic substrates. To produce TFTs on large areas at low cost, it is advantageous to use low cost lithographic tools such as proximity/projection aligners rather than the more expensive stepper tools. Furthermore, due to deformation of substrates in processing (either glass due to high temperature treatment or plastic substrates due to chemical and heat treatment), the alignment issue has to be solved. Typically, misalignment due to deformation increases with the size of the exposure field. One way to compensate for the deformation is to reduce the exposure field by performing multiple exposures on the substrate and then stitching the multiple patterns together. However, this process substantially increases the manufacturing cost due to lower through put and the high cost of stitching.

It would be highly advantageous to have a self-aligned process in which there are no critical alignment steps.

Accordingly, it is an object of the present invention to provide new and improved methods of fabricating self-aligned metal oxide TFTs.

It is another object of the present invention to provide new and improved methods of fabricating metal oxide TFTs including no critical alignment tools or steps and using a minimum of process steps.

SUMMARY OF THE INVENTION

Briefly, to achieve the desired objects of the instant invention in accordance with a preferred embodiment thereof, provided is a method of fabricating metal oxide TFTs on transparent substrates using double self-alignment steps. The method includes a step of providing a transparent substrate, either flexible or rigid, having a front surface and a rear surface, and positioning opaque gate metal on the front surface of the substrate to define a gate area for a TFT. A layer of transparent gate dielectric is deposited on the front surface of the substrate overlying the gate metal and a surrounding area and a layer of transparent metal oxide semiconductor material is deposited on the surface of the layer of transparent gate dielectric. Passivation material is then positioned on the layer of metal oxide semiconductor material by either a subtractive or an additive process to leave a passivation area defining a channel area for the TFT overlying the gate area. In the subtractive process some of the steps include depositing a layer of first positive working photoresist over the layer of a transparent passivation material overlying the gate metal and the surrounding area, exposing portions of the layer of first photoresist from the rear surface of the substrate and developing the layer of first photoresist to remove exposed portions of the layer of first photoresist to form an etch mask, and removing portions of the layer of passivation material and removing the etch mask. In the additive process the passivation layer is exposed directly, with exposed portions removed and unexposed portions remaining. A layer of transparent conductive material is then formed over the passivation area by one of subtractive and additive processes to leave source and drain areas on opposed sides of the channel area. The subtractive process includes the steps of depositing a layer of second negative working photoresist over the layer of transparent conductive material, exposing portions of the layer of second photoresist from the rear surface of the substrate and developing the layer of second photoresist to remove unexposed portions of the layer of second photoresist to form an etch mask, and removing portions of the layer of transparent conductive material by etching or the like. It will be understood that the transparent conductive material can include metal oxide, a thin layer of metal, etc. or in some special applications a transparent layer of organic material. The additive process includes selectively depositing the conductive material directly.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF A PREFERRED EMBODIMENT

Figure 4:
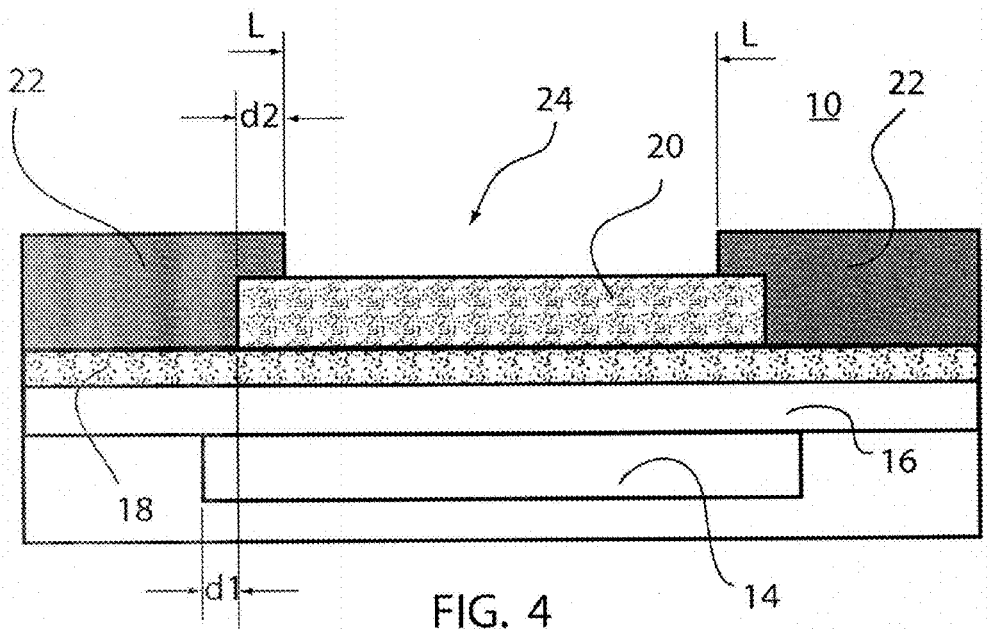
FIG. 4 illustrates an enlarged final stage or phase in the fabrication of TFTs in accordance with the present invention.

Turning now to the drawings, attention is first directed to FIG. 4, for the purpose of briefly explaining prior art problems. The device illustrated in FIG. 4 is a bottom gate and top source/drain metal oxide TFT, designated 10. TFT 10 includes a substrate 12 with gate metal 14 patterned thereon. A gate dielectric layer 16 is deposited over gate metal 14 and a semiconductor active layer 18 is deposited over dielectric layer 16 so as to insulate active layer 18 from gate metal 14. A passivation area 20 is patterned on active layer 18 and source/drain areas 22 are formed on opposite sides of passivation area 20 on the upper surface of active layer 18. The space between the source and drain defines the conduction channel, designated 24, for TFT 10.

In the prior art process of fabricating TFT 10, two critical alignment steps are prevalent. The first critical alignment step is between passivation area 20 (channel protection layer) and gate metal 14. Gate metal 14 should be slightly larger than passivation area 20, indicated as overlap area d1 where d1>0. The second critical alignment is between the pattern for source/drain 22 and passivation area 20. There should be a slight overlap between source/drain areas 22 and passivation area 20, indicated as overlap area d2 where d2>0, so that the etching of the source/drain conductor in the formation of source/drain areas 22 (i.e. the channel space between source/drain 22) will not affect active layer 18. That is the possibility that an etchant can pass around the edges of passivation area 20 and reach active layer 18 is prevented by overlap d2. It will be understood that any alignment patterning includes some tolerance and that the fabrication process includes some deformation tolerance.

Therefore to make a channel length of L (generally the horizontal width of passivation area 20), the distance between the source and drain should be smaller than (L−2×d2). In this relationship or description of L, d2 includes any alignment and deformation tolerance. Further, horizontal width of gate metal 14 should be larger than (L+2×d1). In this relationship or description of L, d1 includes any alignment and deformation tolerance. Thus, the value of overlaps d1 and d2 depends on the alignment tool (i.e. the alignment tolerance) and the amount of substrate deformation during the fabrication process. For low cost tools, overlaps d1 and d2 are relative large, around 5 microns without the added contribution from substrate deformation. For 10 ppm substrate deformation, a field size of 50 cm can contribute another 5 microns to the tolerance. It is desirable at present to fabricate TFTs with channel lengths as small, or smaller, than 10 microns. However, using the prior art fabrication methods described above with low cost tools and large field sizes, forming a channel length of 10 microns is not possible, or alternatively a source/drain spacing of 10 microns, will result in L equaling 30 microns because of the alignment/deformation tolerances included in overlaps d1 and d2.

Figure 1:
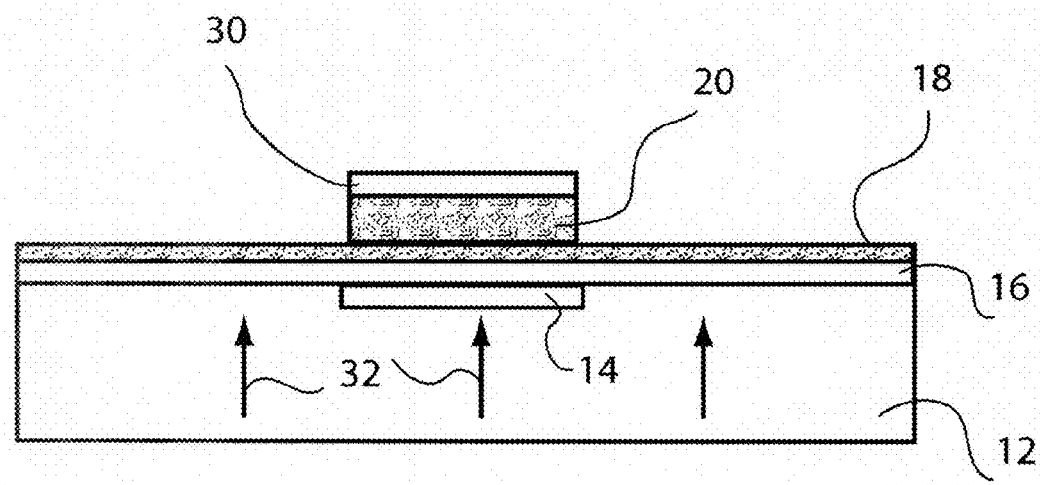
FIG. 1 illustrates a first stage or phase in the fabrication of TFTs in accordance with the present invention.

To understand the double self-alignment procedure of the present invention, FIGS. 1 through 4 illustrate sequential steps in an embodiment fabricated in accordance with the present invention. Turning specifically to FIG. 1, a transparent substrate 12 is illustrated, which may be any convenient material transparent to radiation (i.e. self-alignment exposure) wavelength used in the self-alignment procedure, such as glass, plastic, etc. Throughout this disclosure the terms "transparent" and "opaque" mean that the material being discussed or described is transparent or opaque to radiation (i.e. exposure) wavelengths used in the self-alignment procedure. Gate metal layer 14 is patterned on the upper surface of substrate 12 by any convenient means. Since the position of gate metal layer 14 is not critical virtually any non-critical patterning technique can be used. It will be understood by those of skill in the art that in addition to or instead of forming gate metal layer 14 with a proximity or a projection tool, the gate layer can be formed with any of the various printing processes mentioned above, including imprinting or off-set printing methods. Also, gate metal 14 is an opaque conductive metal that will not transmit the radiation wavelengths used in the self-alignment procedure. While a single gate metal 14 is illustrated for convenience in understanding, it will be understood that this might represent one or more (even all) of the TFTs used in a backplane or other large area applications.

A thin layer 16 of gate dielectric material is formed over gate metal 14 and the surrounding area. For purposes of this disclosure the term "surrounding area" includes at least the area illustrated in the figures (i.e. the gate and channel areas and the source/drain areas). Again, layer 16 may be a blanket layer covering the entire large area application and no alignment is required. The gate dielectric material may be any convenient material that provides the desired dielectric constant for TFT operation and is transparent to the radiation wavelengths used in the self-alignment procedure. A layer 18 of semiconductor metal oxide is deposited over the upper surface of layer 16. Metal oxide layer 18 is transparent to the radiation wavelengths used in the self-alignment procedure. Some typical examples of transparent metal oxides include ZnO, InO, AlZnO, ZnInO, InAlZnO, InGaZnO, ZnSnO, GaSnO, InGaCuO, InCuO, AlCuO, etc. As explained in the above described copending patent application, the metal oxide semiconductor may be amorphous or polycrystalline, however, amorphous is preferred. Layer 18 may be a blanket layer or it may optionally be patterned, depending primarily on the final product.

A passivation layer transparent to the radiation wavelengths used in the self-alignment procedure is then deposited over layer 18. Preferably, the constraint on the passivation layer is that the passivation layer should have very little chemical interaction with the underlying semiconductor metal oxide layer 18. For examples and explanations of this feature see the copending U.S. patent application entitled "Metal Oxide TFT with Improved Carrier Mobility", bearing Ser. No. 12/173,995, filed on 16 Jul. 2008, and incorporated herein by reference. Examples of passivation material that can be processed by a coating process (such as spin coating, slot coating, spray coating, etc.) include polymer PMG1, polystyrene, PMMA, Polyethylene, and spin on glass. Examples of passivation material that can be processed by vacuum deposition (such as thermal evaporation or sputter) include $MgF_2$, TaO, $SiO_2$, etc.

Once the passivation layer is deposited, a positive working photoresist layer 30 is positioned thereon, for example by spin coating, slot coating, spray coating, or the like. Photoresist layer 30 is then exposed from the back (rear surface, below substrate 12 in FIG. 1, represented by arrows 32). Since all of the materials except the gate metal are transparent to the exposing light, gate metal 14 will act as a mask for the alignment of the passivation area 20. Thus, photoresist layer 30 is exposed and developed to form a mask for the etching of the passivation layer into passivation area 20 overlying gate metal 14. As illustrated in FIG. 1, all exposed portions of photoresist layer 33 are removed because the exposed portions of the positive photoresist decompose or disassociate (change relative to the unexposed portion) to allow the exposed areas to be relatively easily removed in the developing stage. The passivation material over the exposed areas can be etched away using the first photoresist as a mask, generally with a light etchant or other dissolving material, with no effect on the lower surface.

In an alternative process, the passivation layer can include a patternable material, such as the positive working photoresist, PMGI, insulating nano-particles embedded in the positive working photo polymer, etc. UV decomposable paintings known to experts in the painting industry can also be used for forming passivation layer 20. In this alternative process the passivation layer is exposed and developed so that only the passivation layer 20 remains overlying gate metal 14. It should be noted that in this specific process the passivation layer does not need to be transparent since the passivation layer is exposed rather than a photoresist layer on the upper surface. Regardless which method or process for patterning passivation area 20 is used, the method should not destroy or adversely affect semiconductor active layer 18. Some extra mask pattern may be needed or used to pattern other parts of the product outside of TFT 10 and the critical gate area. A description of such parts of the product outside of TFT 10 is provided in a copending U.S. patent application entitled "Self-Aligned Transparent Metal Oxide TFT on Flexible Substrate", bearing Ser. No. 11/949,477, filed on 3 Dec. 2007, and incorporated herein by reference. The pattern in such non-critical areas can also be formed by one of several printing methods (such as imprinting, inkjet printing, solution dispensing, etc.) known to artisans in the printing field.

In yet another alternative process, passivation layer 20 over the gate area can be formed by changing surface properties of the substrate under UV exposure, and delivering the passivation material either uniformly or near the targeting patterning area 20 with one of coating (e.g. slot coating, dip coating, spin-coating, etc.) or printing (e.g. inkjet printing, screen printing, solution dispensing, etc.) methods known to the artisans in the field. The ink/solution then forms the pattern of area 20 under the surface force, after which the ink/solution is dried. For example, the surface is primed with an organic vapor having a hydrophobic nature, the surface is then illuminated with UV light from the substrate side as shown in FIG. 1 and the area exposed to UV light becomes hydrophilic. A layer of polystyrene film, for example, can be formed in area 20 by dipping the substrate in polystyrene solution or by coating (slot, spray coating) over the substrate. An additional air flow can be used to help the patterning when the substrate is laid horizontally.

Figure 2:
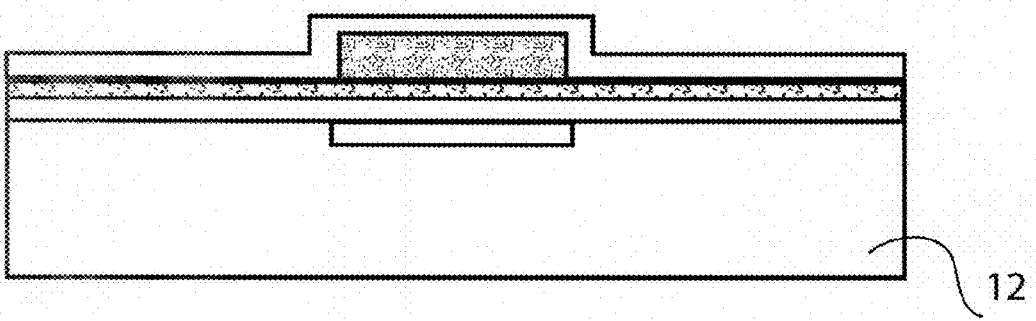
FIG. 2 illustrates a second stage or phase in the fabrication of TFTs in accordance with the present invention.
Figure 3:
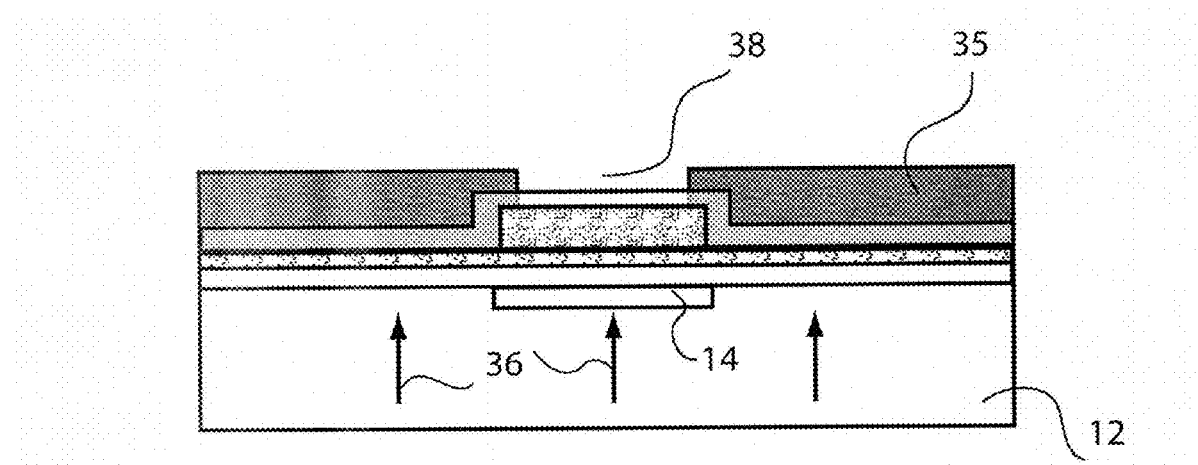
FIG. 3 illustrates a third stage or phase in the fabrication of TFTs in accordance with the present invention.

As illustrated specifically to FIG. 2, once the passivation layer is patterned or completed to produce passivation area 20, a layer of transparent conductive material, such as a transparent conductive metal oxide, a transparent thin layer of metal or metal alloys, etc. (or in some specific applications a layer of transparent organic material) is deposited on the upper surface of the device. The layer may be a blanket layer or some extra mask pattern (very rough and non-critical) may be needed to pattern other parts outside the TFT 10 area. The pattern in the non-critical outside areas can also be formed by delivering the photoresist to the corresponding area with one of the printing techniques (such as solution dispensing, inkjet printing, imprinting, off-set printing, screen printing, etc.) known to artisans in the field. As illustrated in FIG. 3, a layer of negative working photoresist, designated 35, is applied, preferably by some method such as spin coating, spray coating, slot coating, etc. (or one of the printing methods known to artisans in the field) to the upper surface of the layer of transparent conductive material.

Layer 35 of negative working photoresist is exposed from the back (below substrate 12 in FIG. 3, represented by arrows 36). Since all of the materials except gate metal 14 are transparent to the exposing light, gate metal 14 will act as a mask for the alignment of source/drain areas 22. Thus, photoresist layer 35 is exposed and developed to form a mask for the etching of the transparent conductive layer into source/drain areas 22. As illustrated in FIG. 3, a gap 38 is formed in photoresist layer 35 because the negative photoresist hardens when exposed (changes relative to the unexposed portion) and allows the unexposed areas to be removed in the developing stage.

It will be understood that the above described method of placing source/drain conductors using the negative or subtractive photoresist process can be performed in other ways. For example, another way of placing self-aligned source/drain conductors is by an additive process. In the additive process, instead of depositing a conductive layer and then patterning the layer through photolithography and an etch process to form source/drain conductors, the source/drain conductors can be selectively deposited through a photo-deposition process. In this process (hereinafter the "additive process"), the conductive material is deposited only on areas exposed to light (i.e. selective deposition). Some examples of an additive process include: Pt, Pd, Au deposition as described by Ceimig Limited; "Direct patterning ITO transparent conductive coatings", Qiang Wei et al., Chemat Technology, Inc. and conductive nanoparticles embedded in negative working photo polymer matrix, which can be patterned similar to negative resist so that only the conductive material remains in the selected locations (e.g. source/drain areas). In the latter process, in some instances it may be desirable to remove some or all, of the polymer from the matrix, for example through high heat (burn-off), to increase the conductivity. It should be noted that transparency of the conductive material is optional in the additive process because of the selective deposition even though the double self-alignment process is still incorporated.

It will be understood that substantially complete control is possible for the size of overlaps d1 and d2 during the masking and etching stages without requiring additional steps or materials. For example, referring to the first masking step illustrated in FIG. 1, by changing the exposure time or intensity (e.g. increasing or decreasing either one) the amount of remaining photoresist can be decreased or increased, thus altering the width of overlap d1. Similarly, referring to the second masking step illustrated in FIG. 3, by changing the exposure time or intensity (e.g. increasing or decreasing either one) the amount of remaining photoresist can be increased or decreased, thus altering the width of overlap d2. Also, the etch used in conjunction with either of the patterns in FIGS. 1 and 3 can be increased to increase overlap d1 and/or decreased overlap d2. These features and how to adjust them are well known in the self-alignment field and are included in the term "self-align" or "self-alignment" when used to describe the process.

It can be seen that no critical masking step is performed in which expensive tools are required. Also, because of the substantially complete control of the overlap or critical areas, any overlap can be provided from substantially zero to any desired amount without the necessity of sacrificing small channel lengths. Further, no expensive masks or tools are required and larger areas can be exposed during the process so that expensive stepping and stitching or the like are not required. Thus, a novel double self-alignment procedure has been disclosed for forming metal oxide TFTs and additional components on transparent substrates.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating metal oxide TFTs on transparent substrates comprising the steps of:
   providing a transparent substrate having a front surface and a rear surface;
   positioning opaque gate metal on the front surface of the substrate to define a gate area for a TFT;
   depositing a layer of transparent gate dielectric on the front surface of the substrate overlying the gate metal and a surrounding area and a layer of transparent metal oxide semiconductor material on the surface of the layer of transparent gate dielectric;
   depositing a layer of passivation material on the layer of metal oxide semiconductor material;
   exposing portions of the layer of passivation material from the rear surface of the substrate and removing exposed portions of the layer of passivation material to leave a passivation area defining a channel area for the TFT overlying the gate area; and
   depositing conductive material on the layer of metal oxide semiconductor material to form source and drain areas on opposed sides of the channel area using the opaque gate metal as a mask from the rear surface of the substrate.

2. A method as claimed in claim 1 wherein the step of depositing a layer of passivation material includes depositing and processing a positive working photoresist layer.

3. A method as claimed in claim 2 wherein the step of depositing the passivation layer includes depositing and processing a patternable material as the layer of passivation material.

4. A method as claimed in claim 1 wherein the step of depositing conductive material includes using one of a subtractive process and an additive process.

5. A method as claimed in claim 4 wherein the step of depositing conductive material using the subtractive process includes depositing a layer of transparent conductive material.

6. A method as claimed in claim 5 wherein the step of depositing a layer of transparent conductive material includes depositing one of a transparent conductive metal oxide, a transparent layer of thin metal, and a transparent organic layer.

7. A method as claimed in claim 5 wherein the step of depositing conductive material using the subtractive process includes depositing a coating of negative working photoresist on the surface of the layer of transparent conductive material.

8. A method as claimed in claim 4 wherein the step of depositing conductive material using the additive process includes one of selectively depositing one of Pt, Pd, and Au and a process including depositing conductive nanoparticles embedded in negative working photo polymer matrix and exposing and developing the negative working photo polymer matrix.

9. A method of fabricating metal oxide TFTs on transparent substrates comprising the steps of:
   providing a transparent substrate having a front surface and a rear surface;
   positioning opaque gate metal on the front surface of the substrate to define a gate area for a TFT;
   depositing a layer of transparent gate dielectric on the front surface of the substrate overlying the gate metal and a surrounding area and a layer of transparent metal oxide semiconductor material on the surface of the layer of transparent gate dielectric;
   depositing a layer of transparent passivation material on the layer of metal oxide semiconductor material;
   depositing a layer of first photoresist over the layer of passivation material overlying the gate metal and the surrounding area;
   exposing portions of the layer of first photoresist from the rear surface of the substrate and developing the layer of first photoresist to remove exposed portions of the layer of first photoresist to form a second etch mask;
   removing portions of the layer of passivation material to leave a passivation area defining a channel area for the TFT overlying the gate area using the second etch mask from the rear surface of the substrate, and removing the second etch mask; and
   depositing conductive material over the layer of transparent metal oxide semiconductor material and processing the conductive material to provide source and drain areas on opposed sides of the channel area.

10. A method as claimed in claim 9 wherein the layer of first photoresist is positive photoresist.

11. A method as claimed in claim 10 wherein the step of exposing portions of the layer of first photoresist includes using the opaque gate metal as a first self-alignment mask.

12. A method as claimed in claim 9 wherein the step of depositing a layer of transparent passivation material includes one of spin coating, spray coating, and slot coating, one of polymer PMG1, spin on glass, thermal evaporation of $MgF_2$, TaO, and $SiO_2$.

13. A method as claimed in claim 9 wherein the step of depositing the layer of transparent metal oxide semiconductor material includes depositing one of ZnO, InO, AlZnO, ZnInO, InAlZnO, InGaZnO, ZnSnO, GaSnO, InGaCuO, InCuO, and AlCuO.

14. A method as claimed in claim 9 wherein the step of removing portions of the layer of passivation material includes etching the layer of passivation material.

15. A method as claimed in claim 9 wherein the step of depositing conductive material includes using one of a subtractive process and an additive process.

16. A method as claimed in claim 15 wherein the step of depositing conductive material using the subtractive process includes depositing a layer of transparent conductive material.

17. A method as claimed in claim 16 wherein the step of depositing a layer of transparent conductive material includes depositing one of a transparent conductive metal oxide, a transparent layer of thin metal, and a transparent organic layer.

18. A method as claimed in claim 16 wherein the step of depositing conductive material using the subtractive process includes depositing a coating of negative working photoresist on the surface of the layer of transparent conductive material.

19. A method as claimed in claim 15 wherein the step of depositing conductive material using the additive process includes one of selectively depositing one of Pt, Pd, and Au and a process including depositing conductive nanoparticles embedded in negative working photo polymer matrix and exposing and developing the negative working photo polymer matrix.

20. A method of fabricating metal oxide TFTs on transparent substrates comprising the steps of:
   providing a transparent substrate having a front surface and a rear surface;
   positioning opaque gate metal on the front surface of the substrate to define a gate area for a TFT;
   depositing a layer of transparent gate dielectric on the front surface of the substrate overlying the gate metal and a surrounding area and a layer of transparent metal oxide semiconductor material on the surface of the layer of transparent gate dielectric overlying the gate metal and the surrounding area;
   depositing a layer of transparent passivation material on the layer of metal oxide semiconductor material overlying the gate metal and the surrounding area;
   depositing a layer of positive photoresist over the layer of transparent passivation material overlying the gate metal and the surrounding area;
   exposing portions of the layer of positive photoresist from the rear surface of the substrate using the opaque gate metal as a first self-alignment mask and developing the layer of positive photoresist to remove exposed portions of the layer of positive photoresist to form an etch mask;
   etching the layer of passivation material to leave a passivation area defining a channel area for the TFT overlying the gate area, and removing the etch mask;
   depositing a layer of transparent conductive material over the passivation area and exposed portions of the layer of transparent metal oxide semiconductor material;
   depositing a layer of negative photoresist over the layer of transparent conductive material overlying the gate metal and the surrounding area;

exposing portions of the layer of negative photoresist from the rear surface of the substrate using the opaque gate metal as a second self-alignment mask and developing the layer of negative photoresist to remove unexposed portions of the layer of negative photoresist to form an etch mask; and etching the layer of transparent conductive material to leave source and drain areas on opposed sides of the channel area.

21. A method as claimed in claim 20 wherein the step of depositing a layer of transparent passivation material includes one of spin coating, spray coating, and slot coating, one of polymer PMG1, spin on glass, and thermal evaporation of $MgF_2$, TaO, or $SiO_2$.

22. A method as claimed in claim 20 wherein the step of removing portions of the layer of transparent conductive material includes etching the layer of transparent conductive material.

23. A method as claimed in claim 20 wherein the step of depositing transparent conductive material includes depositing one of a transparent conductive metal oxide, a transparent layer of thin metal, and a transparent organic layer.

* * * * *